United States Patent [19]

Schilling et al.

[11] Patent Number: 4,622,619

[45] Date of Patent: Nov. 11, 1986

[54] DECOUPLING CAPACITOR AND METHOD OF MANUFACTURE THEREOF

[75] Inventors: Donald P. Schilling, Albuquerque, N. Mex.; Raymond C. Jodoin, Scottsdale; Joseph E. Johnston, Chandler, both of Ariz.

[73] Assignee: Rogers Corporation, Rogers, Conn.

[21] Appl. No.: 711,478

[22] Filed: Mar. 13, 1985

[51] Int. Cl.⁴ .................. H01G 9/05; H01G 7/00; H01G 4/10

[52] U.S. Cl. .................. 361/306; 29/25.42; 361/321

[58] Field of Search .............. 361/306, 321 C, 433 C, 361/404, 405, 386; 29/25.42; 174/52 FP, 52 PE

[56] References Cited

U.S. PATENT DOCUMENTS

| | | | |
|---|---|---|---|
| 3,496,435 | 2/1970 | Manley | 361/321 C X |
| 3,689,804 | 9/1972 | Ishihama et al. | 174/52 PE X |
| 4,494,169 | 1/1985 | Watson | 361/433 C X |
| 4,497,012 | 1/1985 | Gottlieb et al. | 29/25.42 X |
| 4,521,828 | 6/1985 | Fanning | 361/386 |

*Primary Examiner*—Donald A. Griffin
*Attorney, Agent, or Firm*—Fishman & Dionne

[57] ABSTRACT

A decoupling capacitor and method of manufacture thereof are presented wherein the decoupling capacitor is formed from a lead frame which contains the four leads of the capacitor (two of which are electrically inactive) on a single plane. The use of a lead frame automatically provides the dimensional tolerances necessary for encapsulation molding of the decoupling capacitor. The decoupling capacitor is a hermetically sealed capacitive unit consisting of a multilayer monolithic ceramic capacitor (for higher capacitance values in combination with other desirable properties such as flat capacitance vs. temperature characteristics), active leads bonded to the capacitor and dummy pins for auto-insertion into printed circuit boards.

34 Claims, 23 Drawing Figures

DECOUPLING CAPACITOR AND METHOD OF MANUFACTURE THEREOF

BACKGROUND OF THE INVENTION

This invention relates to the field of decoupling capacitors for integrated circuits. More particularly, this invention relates to novel and improved decoupling capacitors, and methods of formation thereof wherein the capacitors are formed from a lead frame which contains the four leads of the capacitor (two of which of electrically inactive "dummy" pins) on a single plane. This lead frame construction permits the decoupling capacitor to be subjected to encapsulation molding to form decoupling capacitors which are auto-insertable into printed circuit boards for use in conjunction with dual-in-line integrated circuits or other electronic components.

U.S. Pat. No. 4,502,101 (which is assigned to the assignee hereof, and the entire contents of which are incorporated herein by reference) discloses a decoupling capacitor for an integrated circuit package. The decoupling capacitor of that prior application is a thin rectangular chip of ceramic material which is metallized on opposite sides and has leads from the metallized coatings on opposite sides of the chip at two points adjacent a pair of diagonally opposed corners of the rectangularly shaped ceramic chip. The two leads are bent downwardly, and the decoupling capacitor assembly is encapsulated in a film of nonconductive material. In accordance with the teachings of that prior application, the decoupling capacitor is dimensioned so as to be received in the space between the two rows of leads extending from a conventional dual-in-line integrated circuit. The two leads from the decoupling capacitor are plugged into a printed circuit board, with these leads from the capacitor being inserted into the printed circuit through holes to which the ground power supply conductors are connected. The associated integrated circuit or other electronic component is then positioned over the capacitor and inserted into the board such that the power supply leads of the integrated circuit or other component will be positioned in the same through holes of the printed circuit board in which the two capacitor leads have been inserted.

The diagonally located leads or pins on the decoupling capacitor of U.S. Pat. No. 4,502,101 have resulted in a problem when it is desired to automatically insert the decoupling capacitors into the printed circuit board. Standard auto-insertion equipment is available for inserting integrated circuit elements into the printed circuit boards. The insertion heads on standard auto-insertion equipment grasp the integrated circuit about the bent terminal pins or leads of the integrated circuit. Since there are two symmetric rows of pins on the integrated circuit element, the auto-insertion equipment can grasp the integrated circuit element symmetrically and stably for insertion. However, when insertion of the decoupling capacitor of prior U.S. Pat. No. 4,502,101 is attempted with the same auto-insertion equipment, an unstable condition and misalignment results because of the fact that the decoupling capacitor, rather than having two symmetrical rows of pins, has only two pins at diagonally opposite corners of the rectangular capacitor. Because of the presence of only the two pins, the capacitor "cocks" in the insertion head with the result that misalignment occurs between the terminals of the capacitor in the corresponding holes on the printed circuit board.

Since it is extremely desirable to auto-insert the decoupling capacitors into the printed circuit boards, and since it is equally desirable to perform that auto-insertion with the same auto-insertion equipment used with the integrated circuit elements, a significant problem is encountered with the decoupling capacitor of the prior application, not from the standpoint of its electronic operability and effectiveness, but rather from the standpoint of adapting it to high volume assembly techniques.

A need also exists for a decoupling capacitor structure which is also auto-insertable, hermetically sealed, and capable of being manufactured by automated assembly processes.

U.S. Pat. No. 4,475,143 (assigned to the assignee hereof) discloses one approach to solving the above discussed auto-insertion problem by the incorporation of dummy or stabilizing pins in a decoupling capacitor assembly. U.S. Pat. Nos. 4,491,895, 4,494,169, 4,494,170, 4,497,012, U.S. patent application Ser. No. 551,576, now U.S. Pat. No. 4,511,951, and U.S. patent application Ser. No. 551,468, now U.S. Pat. No. 4,532,572, all of which are assigned to the assignee hereof, present other constructions of and methods for forming decoupling capacitors with dummy pins or molded stabilizing lugs.

Presently, decoupling capacitors of the type hereinabove discussed and disclosed in the cited issued patents and pending patent applications do not easily lend themselves to a molding encapsulating process, in part, because they are comprised of a two layer assembly i.e., a top conductor with two leads and a bottom conductor with two leads, one lead from each conductor being an electrically inactive "dummy" lead. Unfortunately, currently used assembly methods of these decoupling capacitors do not provide the parallelism and perpendicularity tolerances between the two conductive layers required for a good molding encapsulation. It will be appreciated by those skilled in the art that a molded encapsulated package is important in providing environmental protection of the capacitor and to provide the dimensional stability, mass, weight, etc. needed for automatic insertion using adapted integrated circuit DIP inserters.

Additionally, and of equal importance, presently used manufacturing procedures for decoupling capacitors of the type hereinabove discussed (i.e., which include dummy leads) are not particularly well suited for incorporating multilayer monolithic ceramic capacitor chips as the capacitive element for the decoupling capacitor device. In effect then, this situation limits the capacitive element to be a single layer capacitor of limited obtainable capacitance per unit volume. However, a method of manufacturing decoupling capacitors with multilayer ceramic capacitor chips with only two leads (i.e., no dummy leads) is disclosed in U.S. patent application Ser. No. 690,117, now U.S. Pat. No. 4,584,627, which is assigned to the assignee hereof. It should be understood that there is a need for efficient and economical decoupling capacitors and methods of manufacture thereof having higher capacitance volumes for use in decoupling the new generation of integrated circuit devices, which are faster and consume more power (i.e., 256K memory integrated circuits).

SUMMARY OF THE INVENTION

The above discussed and other problems of the prior art are overcome or substantially reduced by the new and improved decoupling capacitors of the present invention and the method of manufacture thereof. The decoupling capacitor of the present invention is formed from a lead frame which contains the four leads of the capacitor (two of which are electrically inactive dummy leads) on a single plane. The use of such a lead frame will automatically provide the dimensional tolerances for a good, efficient encapsulation molded decoupling capacitor package. The present invention thus presents constructions of and methods for forming improved decoupling capacitors which are hermetically sealed, auto-insertable and manufactured in a lead frame followed by an encapsulation molding process.

In accordance with the method of the present invention, a pair of conductors, each having a lead connected thereto are formed from a continuous strip of electrically conductive material. A pair of dummy leads, each being associated with a conductor, but isolated therefrom, is also formed from the strip. Thereafter, a multilayer monolithic ceramic capacitor is placed between the two conductors (preferably on a shelf formed from the conductors). The multilayer capacitor includes first and second conductive end surfaces which are bonded respectively to each conductor. Thereafter, the leads, ceramic chip and conductors are all encapsulated by a molding process with the leads extending through the encapsulate material. Finally, the decoupling capacitor is severed from the lead frame. The decoupling capacitor of the present invention will thus be both hermetically sealed and automatically insertable for use in conjunction with integrated circuit DIP inserter devices.

The above discussed and other features and advantages of the present invention will be apparent to and understood by those skilled in the art from the following detailed description and drawings.

BRIEF DESCRIPTION OF THE DRAWINGS

Referring now to the drawings, wherein like elements are numbered alike in the several figures.

DESCRIPTION OF THE PREFERRED EMBODIMENT

The present invention presents constructions of and methods for forming improved decoupling capacitors which are hermetically sealed, auto-insertable and manufactured in a lead frame followed by an encapsulation molding process. FIGS. 1–12 relate to a process for forming an encapsulated decoupling capacitor having a planar single layer ceramic chip capacitor therein. FIGS. 13–21 relate to a process for forming an encapsulated decoupling capacitor from a lead frame having a multilayer ceramic chip capacitor therein.

Figure 1:
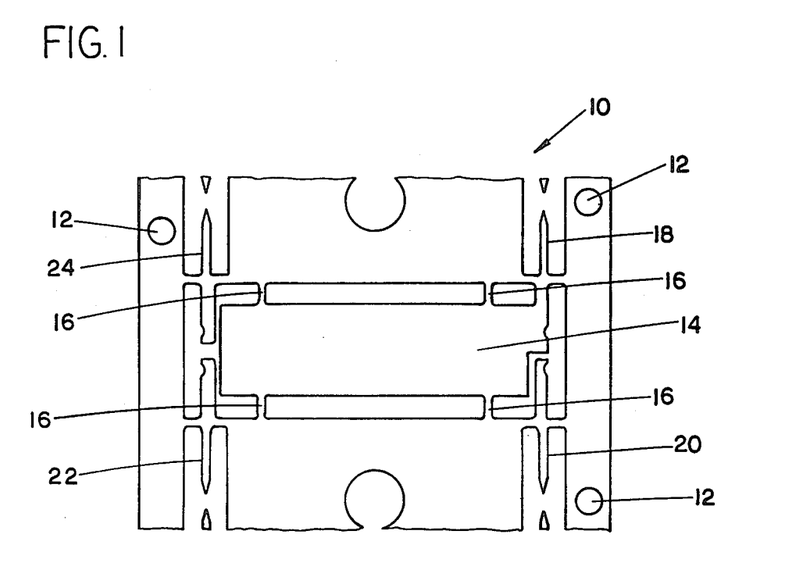
FIG. 1 is a plan view of a lead frame used in forming the decoupling capacitor having a single layer ceramic chip therein in accordance with the present invention.

Referring first to FIG. 1, a lead frame used in accordance with the present invention is shown generally at 10. Lead frame 10 is a continuous planar strip of conductive material i.e., copper, which is provided with openings 12 along the respective side edges thereof for registration and transport. It will be appreciated that FIG. 1 shows only a small portion of a lead frame which is suitable for forming a single decoupling capacitor in accordance with the present invention. It will further be appreciated that lead frame 10 is preferably a stamped part wherein all the components thereof are rigid. Thus, the desired lead frame configuration is formed by removing unwanted material from the strip of conductive material using any suitable and conventional technique. Lead frame 10 includes a bottom or lower conductor 14 which has a generally rectangular configuration and is attached to the rest of the lead frame via four support bars 16.

Lead frame 10 further includes four leads or pins 18, 20, 22 and 24. At this point in the decoupling capacitor formation process, lead 18 is mechanically attached to bottom conductor 14 and is therefore an electrically active pin while the other leads 20, 22, and 24 are isolated from bottom conductor 14 and are therefore electrically inactive or dummy pins. However, as will be discussed in more detail below, lead 22 which is diagonally across from electrically active lead 18 will be transformed into an electrically active lead along with lead 18. An important feature of the present invention is that all four leads or pins 18, 20, 22 and 24 are in the same plane. Thus, as the leads are generated at the same time, necessary tolerances which affect the molding process (injection, transfer) can be provided.

Figures 2, 3:
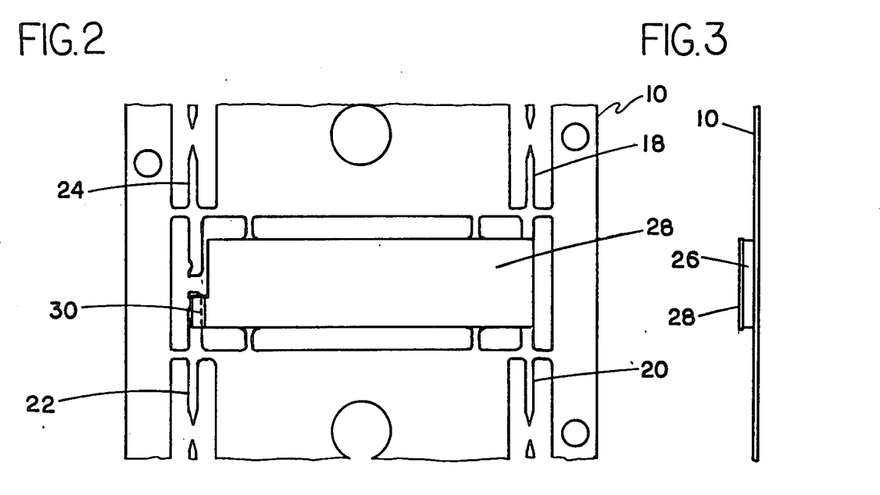
FIG. 2 is a plan view of the lead frame of FIG. 1 showing a first step in forming the decoupling capacitor of the present invention.
FIG. 3 is a side elevation view of the lead frame of FIG. 2.

Referring now to FIGS. 2 and 3, a single layer capacitive ceramic chip indicated at 26 (FIG. 3) is positioned over bottom conductor 14 and attached thereto by a suitable adhesive to the conductor body. Capacitive ceramic chip 10 consists of a ceramic capacitor element, such as barium titanate, in the form of a flat, generally rectangular plate. Ceramic chip 26 will include a top conductor or conductor cap 28 thereon which may be adhesively applied thereto; or may consist of a coating of conductive material on the ceramic chip 26. Ceramic chip 26 and top conductor 28 will be disposed over and cover all of the lower conductor 14 and portions of active pin tab 18 and dummy pin tab 20 (lead 20 being positioned directly opposite active pin 18 as shown in FIG. 2). Note that the two dummy leads 22 and 24 do not come into contact with the capacitor chip 26. Preferably, dummy lead 20 (located oppositive active lead 18) will be electrically isolated from the chip by a suitable coating i.e., solder mask, etc.

Still referring to FIGS. 2 and 3, dummy lead 22 which is located diagonally opposite active lead 18 will contact ceramic chip 26 via top conductor 28. Top conductor 28 is adhesively attached to the ceramic chip and is provided with a bent tang portion 30 (see FIG. 9) which provides electrical and mechanical attachment to dummy lead 22. This contact between the bent tang portion 30 of top conductor 28 and dummy lead 22 thus renders dummy lead 22 an electrically active lead similar to electrically active lead 18. It will be appreciated that attachment of bent tang 30 to lead 22 may be accomplished by solder, conductive adhesives, riveting, splining, welding, ultrasonic welding, or any other suitable method. Alternatively, if a bent tang portion is not provided on top conductor 28, wire bonding techniques can be used to render the required dummy lead 22 an active lead. It will be appreciated then, that at this point in the decoupling capacitor formation process, the partially assembled decoupling capacitor of the present invention will have two, diagonally opposite electrically active leads 18 and 22 and two diagonally opposite electrically inactive dummy leads 20 and 24.

Figures 4, 5:
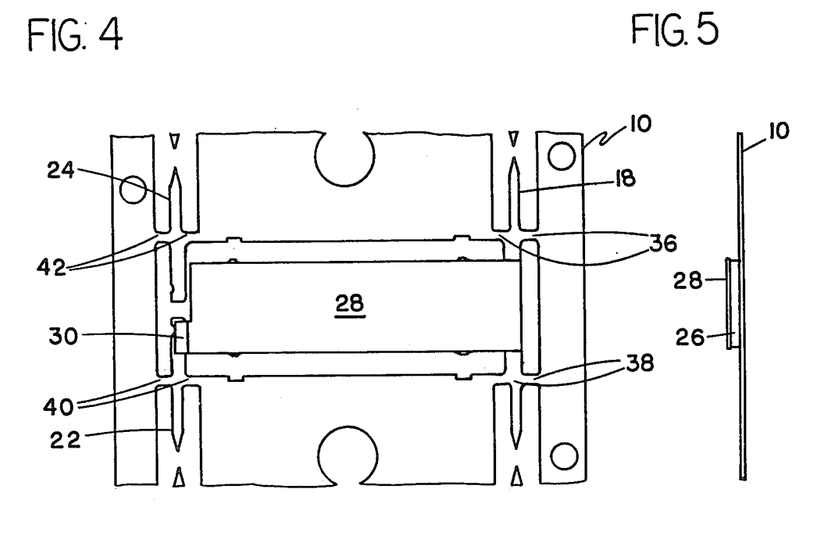
FIG. 4 is a plan view of the lead frame of FIG. 1 showing a second step in forming the decoupling capacitor of the present invention.
FIG. 5 is a side elevation view of the lead frame of FIG. 4.

Referring now to FIGS. 4 and 5, in the next step in forming the decoupling capacitor of the present invention, the support or tie bars 16 are removed. These support bars hold the conductor body 14 in position during the several preceeding processes i.e. attaching a top conductor and bonding or laminating the components together. As these support bars would protrude from the final molded package and interfere with the molding process, they are removed at this point in the procedure.

Figures 6, 7:
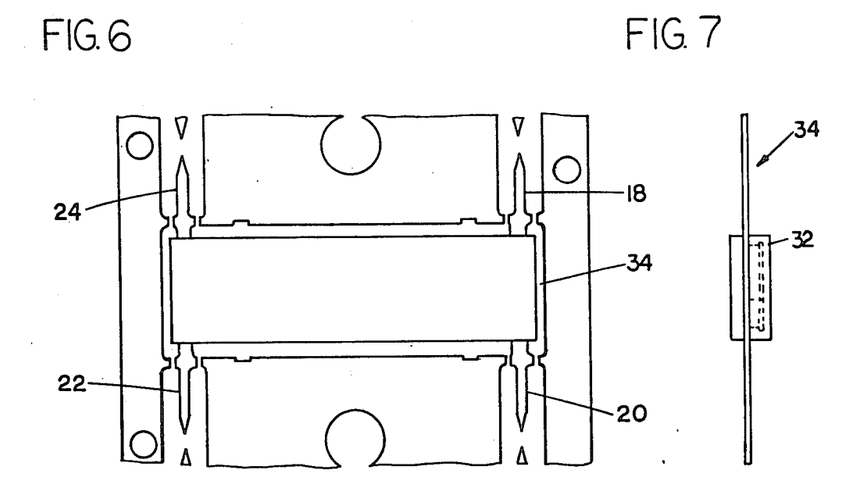
FIG. 6 is a plan view of the lead frame of FIG. 1 showing a third step in forming the decoupling capacitor of the present invention.
FIG. 7 is a side elevation view of the lead frame of FIG. 6.
Figure 8:
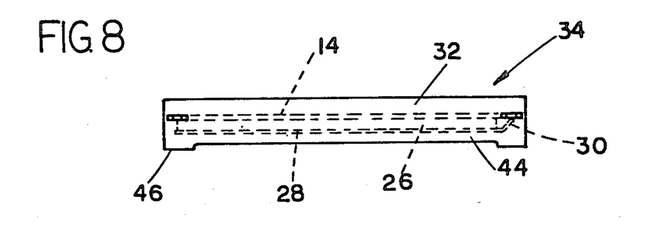
FIG. 8 is a cross-sectional elevation view of a portion of the lead frame of FIG. 6.

Turning now to FIGS. 6 thru 8, the lead frame 10 is shown after encapsulation molding and deflashing has taken place. The molding encapsulation identified at 32 may utilize any suitable and well known molding procedures. Note that no exposed conductive surfaces are left on the decoupling capacitor except for the two active leads 18 and 22 and the two dummy leads 20 and 24 protruding therefrom. Molded encapsulating material 32 acts to hermetically seal and protect the various components of decoupling capacitor 34. Following molding, the decoupling capacitor preferrably undergoes a deflashing process. Deflashing is a process that removes excess encapsulate material that may be attached to the package during molding. This excess material is usually prevalent at the mating surfaces of the mold. It will be appreciated that the lead frame assembly is turned over for proper pin orientation prior to the molding process.

After molding and deflashing, the decoupling capacitor in accordance with the present invention and now identified at 34 is severed from any remaining support structures identified in FIGS. 1–4 at 36, 38, 40 and 42. In a preferred embodiment, at least a pair of standoffs or risers 44 and 46 are molded into the decoupling capacitor to set off the decoupling capacitor from a circuit board for cleaning and other purposes.

Figure 9:
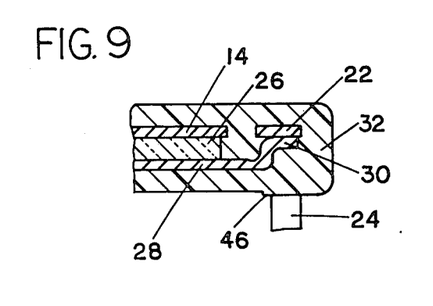
FIG. 9 is a cross-sectional elevation view along the line 9—9 of FIG. 10.
Figure 10:
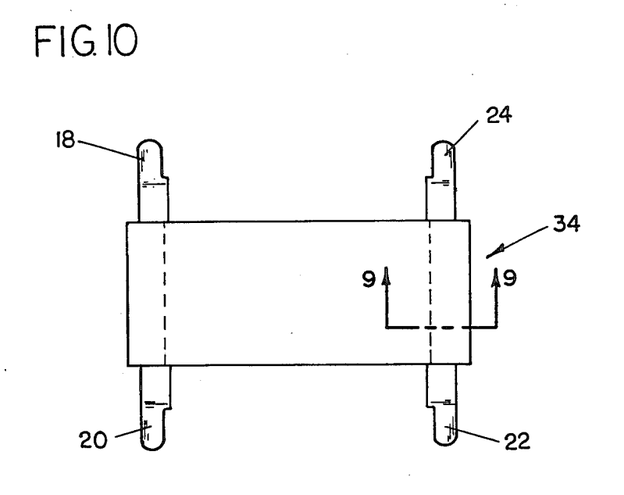
FIG. 10 is a plan view of the decoupling capacitor of the present invention including a single layer ceramic chip therein.
Figure 11:
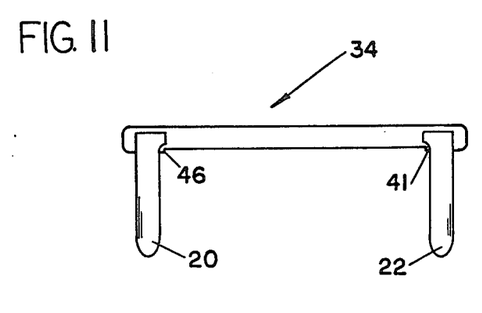
FIG. 11 is a side elevation view of the decoupling capacitor of FIG. 10.
Figure 12:
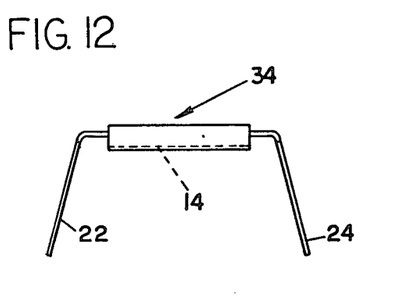
FIG. 12 is an end view of the decoupling capacitor of FIG. 10.

In FIGS. 10–12, the decoupling capacitor 34 is shown after being trimmed, and after leads 18, 20, 22 and 24 have been bent to their final and proper orientation. As mentioned, FIG. 9 is a cross-sectional elevation view detailing the manner in which the bent tang portion 30 of top conductor 28 forms an electrical and mechanical connection to lead 22 to transform the same from a dummy lead to an active lead.

In accordance with the decoupling capacitor of the present invention which is formed by the method shown in FIGS. 1–12, a novel lead frame 10 is utilized which provides the necessary dimensional tolerances for a good and efficient encapsulated molded decoupling capacitor package. As mentioned, the lead frame 10 contains the four leads of the capacitor on a single plane. The use of such a lead frame automatically provides the critical dimensional tolerances necessary for encapsulation molding of the decoupling capacitor. The final decoupling capacitor device will be both hermetically sealed and automatically insertable using adapted integrated circuit DIP inserters.

Figure 13:
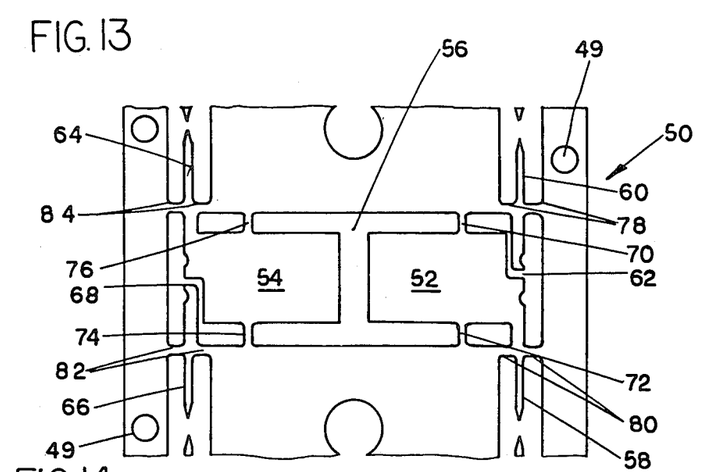
FIG. 13 is a plan view of a lead frame used in forming a decoupling capacitor having a multilayer ceramic chip therein in accordance with the present invention.
Figure 14:
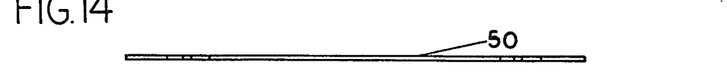
FIG. 14 is a side elevation view of the lead frame of FIG. 13.

Turning now to a discussion of FIGS. 13–21, another embodiment of the present invention is shown wherein multilayer monolithic ceramic chip capacitors (MLC's) are used in place of the thin flat single layer capacitive chips associated with the embodiment of FIGS. 1–12. In FIG. 13, a lead frame which may be formed in the same manner as lead frame 10 (as discussed above) having holes 49 for alignment and transport is generally identified at 50. Lead frame 50 includes two conductor body portions 52 and 54 separated therebetween by an "H" shaped space or opening 56. Conductor 52 includes an electrically active pin or lead 58 integrally attached thereto and an electrically inactive dummy pin or lead 60 which is isolated therefrom by a space 62. Similarly, conductor 54 includes an electrically active pin or lead 64 which is integrally attached thereto and an electrically inactive dummy pin or lead 66 which is separated from conductor 54 by space 68. As was discussed with regard to lead frame 10 of FIGS. 1–12, lead frame 50 includes several support structures which support the conductors 52, 54 and leads 58, 60, 64, 66 to the frame during the various processes. These support structures include supports 70, 72, 74 and 76 which act to hold conductors 52 and 54 in position on the lead frame; and supports 78, 80, 82 and 84 which provide support for the various leads 58, 60, 64 and 66.

Figure 15:
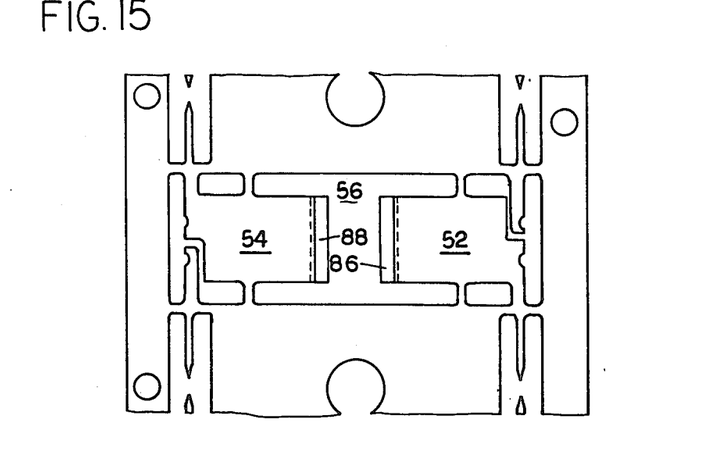
FIG. 15 is a plan view of the lead frame of FIG. 13 showing a first step in forming the multilayer ceramic chip decoupling capacitor of the present invention.
Figure 16:
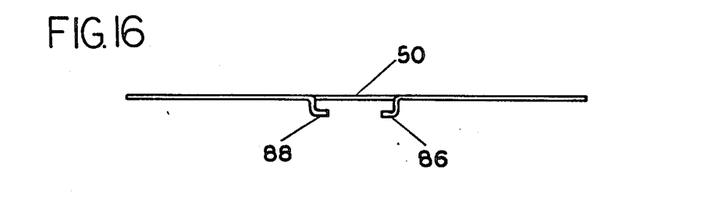
FIG. 16 is a side elevation view of the lead frame of FIG. 15.
Figure 17:
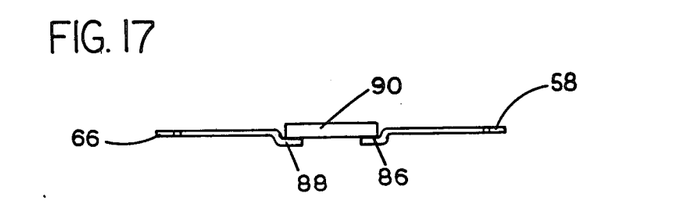
FIG. 17 is a side elevation view of a multilayer chip decoupling capacitor in accordance with the present invention prior to encapsulation.
Figure 18A:
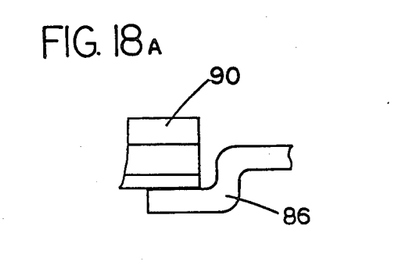
FIG. 18A is an enlarged cross-sectional elevation view of a portion of the decoupling capacitor of FIG. 17.
Figure 18B:
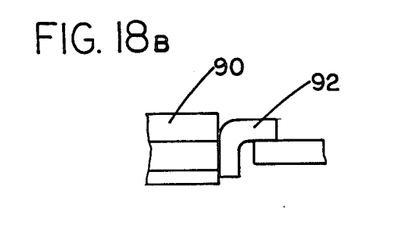
FIG. 18B is an enlarged cross-sectional elevation view of a portion of the capacitor of FIG. 17 showing an optional configuration.

Referring now to FIGS. 15 and 16, a shelf is formed which is suitable for accepting and retaining a multilayer ceramic chip capacitor. This shelf is comprised of the two inwardly facing portions 86 and 88 of conductors 52 and 54 which are bent to form a support or shelf (See FIG. 16). Next, a multilayer ceramic capacitor 90 is attached to each conductor portion 86, 88 (shelf). Attachment can be made by solder paste or any other suitable well known method. FIG. 18A is an enlarged view showing attachment between capacitor 90 and conductor portion 86. In an alternative embodiment shown in FIG. 18B, the step of forming a shelf may be eliminated by providing the multilayer capacitor chip with 90° or other suitably angled tabs 92. It will be appreciated that any other suitable and well known structure may be used to effect connection between the multilayer capacitor and conductors 52 and 54, such as, for example, butt joints or tangs.

Preferably, multilayer ceramic capacitor 90 is of the commercially available type utilizing interleaved layers of ceramic 91 and metallization, with alternate layers of metal 94 and 96 connected to end plate electrodes 98 and 100, respectively, and fired to form a monolithic block. However, it will be appreciated that any other suitable multilayer ceramic chip construction may be utilized in accordance with the present invention.

Figure 19:
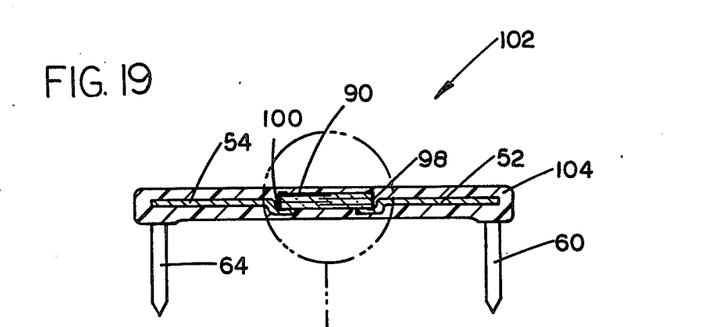
FIG. 19 is a cross-sectional elevation view of the decoupling capacitor of FIG. 17 after encapsulation and along the line 19 19 of FIG. 20.
Figure 19A:
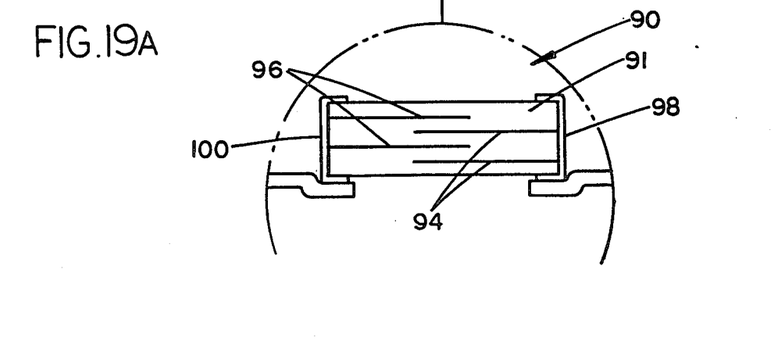
Figure 20:
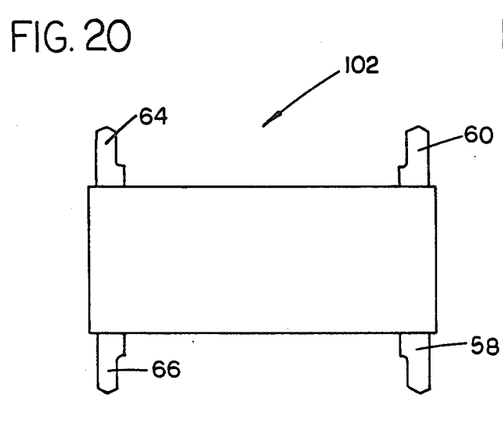
FIG. 20 is a plan view of a multilayer ceramic chip decoupling capacitor in accordance with the present invention.
Figure 21:
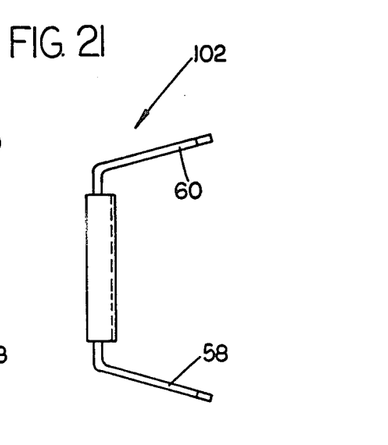
FIG. 21 is an end view of the multilayer chip decoupling capacitor of FIG. 20.

FIGS. 19-21 show the multilayer ceramic chip decoupling capacitor after encapsulation molding and after the several support structures 70 thru 84 have been severed. The final decoupling capacitor construction generally identified at 102 thus includes a pair of electrically isolated dummy leads 60 and 66 and a pair of electrically active leads 58 and 64 which are integrally attached to conductors 52 and 54, respectively. In turn, conductors 52 and 54 are electrically attached to electrodes 98 and 100, respectively, of multilayer capacitor 90. The whole assembly is then provided with an encapsulating material 104 with only the two electrically active leads 58 and 64 and the two electrically inactive leads 60 and 66 protruding outwardly therefrom.

As in the single layer chip embodiment of FIGS. 1-12, the multilayer ceramic chip embodiment of FIGS. 13-21 utilizes a lead frame 50 which provides all four leads 58, 60, 64 and 66 in a single plane. The use of this lead frame 50 automatically provides the dimensionally critical tolerances necessary for encapsulation molding of the decoupling capacitor 102. For many applications, decoupling capacitor 102 of FIGS. 13-21 may be preferred over decoupling capacitor 34 of FIGS. 1-12. This is because decoupling capacitor 102 utilizes a high capacitance multilayer monolithic ceramic chip capacitor 90. Such a capacitor provides much higher capacitance values along with other desirable properties such as a flat capacitance vs. temperature characteristics, than are obtainable using convention planar single layer ceramic capacitors.

The embodiment of the present invention as shown in FIGS. 13-21 provide certain other features and advantages which may be preferrable over the single layer capacitor embodiment of FIGS. 1-12. For example, unlike the method of forming the decoupling capacitor 34 of FIGS. 1 thru 12, decoupling capacitor 102 does not require a top conductor or conductor cap to be applied onto the capacitor chip. Also, no lamination of the top and bottom conductors to the capacitor chip is required with decoupling capacitor 102. It will thus be appreciated that the elimination of at least these two steps will provide decreased costs and production time in forming decoupling capacitor 102 (relative to forming decoupling capacitor 34).

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. The method of making a capacitor, including the steps of:
    removing unwanted material from a strip of electrically conductive material to define a first substantially planar conductor having a first active lead connected thereto and a second substantially planar conductor having a second active lead connected thereto, said first and second conductor being coplanar;
    removing further unwanted material from said strip of electrically conductive material to define a first dummy lead associated with said first conductor, but electrically isolated therefrom, and a second dummy lead associated with said second conductor, but electrically isolated therefrom, at least a portion of said first and second active leads and said first and second dummy leads being coplanar with each other and with said first and second conductors;
    placing a multilayer capacitor element between said first and second conductors, said capacitor element having first and second conductive end surfaces, with said first conductive end surface being in electrical contact with said first conductor and said second conductive end surface being in electrical contact with said second conductor;
    bonding the above elements to form an assembly with said first and second conductors and said multilayer capacitor element bonded together; and
    encapsulating said assembly to enclose and seal all of said assembly other than a portion of said first and second active leads and said first and second dummy leads.

2. The method of claim 1 including the step of:
    forming a support means in said first and second conductors; and
    placing said multilayer capacitor element on said support means.

3. The method of claim 2 wherein said support means comprises:
    a first bent portion in said first conductor and a second bent portion in said second conductor, said bent portions being inwardly facing and defining a shelf.

4. The method of claim 1 including the step of:
    providing a first tab to said first conductive end surface of said capacitor element and providing a second tab to said second conductive end surface of said capacitor element; and
    bonding said first and second tabs to said first and second conductors, respectively.

5. The method of claim 4 wherein:
    said first and second tabs have a 90 degree bend.

6. The method of claim 1 wherein said step of removing unwanted material from said electrically conductive material further includes the steps of:
    forming support structure for supporting said first and second conductors in said conductive strip; and
    severing said support structure prior to the encapsulating step.

7. The method of claim 1 wherein said step of removing unwanted material from said electrically conductive material further includes the steps of:
  forming support structure for supporting said first and second leads and said dummy leads in said conductive strip; and
  severing said support structure subsequent to the encapsulating step.

8. The method of claim 1 including:
  bonding said first and second conductive end surfaces of the capacitor element with conductive adhesive.

9. The method of claim 1 including:
  forming registration holes in said strip of electrically conductive material.

10. The method of claim 1 wherein:
  said active leads are at a first pair of diagonally opposed locations and said dummy leads are at a second pair of diagonally opposed locations.

11. The method of claim 1 wherein:
  said capacitive element is a ceramic material having interleaved conductive layers with a pair of conductive end surfaces.

12. The method of claim 1 including the step of:
  providing set-off means on said encapsulated assembly.

13. A capacitor including:
  a first substantially planar electrical conductor;
  a second substantially planar electrical conductor, said second electrical conductor being coplanar with said first electrical conductor;
  a first active lead extending from said first conductor at a first position;
  a second active lead extending from said second conductor at a second position;
  a first dummy lead associated with said first conductor, but electrically isolated therefrom at a third position;
  a second dummy lead associated with said second conductor, but electrically isolated therefrom at a fourth position;
  at least a portion of said first and second active leads and said first and second dummy leads being coplanar with each other and with said first and second conductors;
  a multilayer capacitive element between said first and second conductors, said capacitive element having first and second conductive end surfaces, with said first conductive end surface being in electrical contact with said first conductor and said second conductive end surface being in electrical contact with said second conductor; and
  a molded encapsulating cover encapsulating said conductors and capacitive element, with said active and dummy leads extending from said encapsulating cover at said first, second, third and fourth positions.

14. The capacitor of claim 13 including:
  support means in said first and second conductors, said multilayer capacitive element being positioned on said support means.

15. The capacitor of claim 14 wherein said support means comprises:
  a first bent portion in said first conductor and a second bent portion in said second conductor, said bent portions being inwardly facing and defining a shelf.

16. The capacitor of claim 13 including:
  a first tab means on said first conductive end surface of said capacitive element;
  a second tab means on said second conductive end surface of said capacitive element; and
  said first and second tab means being bonded to said first and second conductors, respectively.

17. The capacitor of claim 16 wherein:
  said first and second tabs have a 90 degree bend.

18. The capacitor of claim 16 wherein:
  said bonding is accomplished by a conductive adhesive.

19. The capacitor of claim 13 wherein:
  said first and second conductive end surfaces of said capacitive element are bonded to said first and second conductors, respectively.

20. The capacitor of claim 19 wherein:
  said bonding is accomplished by a conductive adhesive.

21. The capacitor of claim 13 wherein:
  said active leads are at a first pair of diagonally opposed locations and said dummy leads are at a second pair of diagonally opposed locations.

22. The capacitor of claim 13 wherein:
  said capacitive element is a ceramic material having interleaved conductive layers with a pair of conductive end surfaces.

23. The capacitor of claim 13 including:
  set-off means on said encapsulated cover.

24. An array of capacitors positioned between a pair of edge strips from which a pair of conductors and active and dummy leads of the capacitors are formed, each of said capacitors having:
  a first substantially planar electrical conductor;
  a second substantially planar electrical conductor;
  a first active lead extending from said first conductor at a first position;
  a second active lead extending from said second conductor at a second position;
  a first dummy lead associated with said first conductor, but electrically isolated therefrom at a third position;
  a second dummy lead associated with said second conductor, but electrically isolated therefrom at a fourth position;
  at least a portion of said first and second active leads and said first and second dummy leads being coplanar with each other and with said first and second conductors;
  a multilayer capacitive element between said first and second conductors, said capacitive element having first and second conductive end surfaces, with said first conductive end surface being in electrical contact with said first conductor and said second conductor end surface being in electrical contact with said second conductor; and
  a molded encapsulating cover encapsulating said conductors and capacitive element, with said active and dummy leads extending from said encapsulating cover at said first, second, third and fourth positions.

25. The capacitor of claim 24 including:
  support means in said first and second conductors, said multilayer capacitive element being positioned on said support means.

26. The capacitor of claim 25 wherein said support means comprises:
  a first bent portion in said first conductor and a second bent portion in said second conductor, said bent portions being inwardly facing and defining a shelf.

27. The capacitor of claim 24 including:
a first tab means on said first conductive end surface of said capacitive element;
a second tab means on said second conductive end surface of said capacitive element; and
said first and second tab means being bonded to said first and second conductors, respectively.

28. The capacitor of claim 27 wherein:
said first and second tabs have a 90 degree bend.

29. The capacitor of claim 27 wherein:
said bonding is accomplished by a conductive adhesive.

30. The capacitor of claim 24 wherein:
said first and second conductive end surfaces of said capacitive element are bonded to said first and second conductors, respectively.

31. The capacitor of claim 30 wherein:
said bonding is accomplished by a conductive adhesive.

32. The capacitor of claim 24 wherein:
said active leads are at a first pair of diagonally opposed locations and said dummy leads are at a second pair of diagonally opposed locations.

33. The capacitor of claim 24 wherein:
said capacitive element is a ceramic material having interleaved layers with a pair of conductive end surfaces.

34. The capacitor of claim 24 including:
set-off means on said encapsulated cover.

* * * * *